United States Patent
Lee

(10) Patent No.: US 6,735,227 B2
(45) Date of Patent: May 11, 2004

(54) LASER-BASED LIGHT SOURCE

(75) Inventor: Jung Yuan Lee, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 223 days.

(21) Appl. No.: 10/046,340

(22) Filed: Oct. 29, 2001

(65) Prior Publication Data

US 2003/0026304 A1 Feb. 6, 2003

(30) Foreign Application Priority Data

Aug. 3, 2001 (TW) ...................................... 90213253 U

(51) Int. Cl.$^7$ ................................................. H01S 3/10
(52) U.S. Cl. .............................. 372/29.021; 372/29.02; 372/36; 372/108
(58) Field of Search ................................ 372/29.02, 36, 372/108, 29.021

(56) References Cited

U.S. PATENT DOCUMENTS 5,809,050 A * 9/1998 Baldwin et al. .............. 372/43

* cited by examiner

Primary Examiner—James Davie
(74) Attorney, Agent, or Firm—Wei Te Chung

(57) ABSTRACT

A laser-based light source includes a laser (26), two optical detectors (27), a diffraction grating (29) mounted in a can (28), and a controlling circuit (31). A plurality of parallel grooves (293) is defined in a bottom face (292) of the diffraction grating. Each groove has a depth "d." A groove separation "a" is defined between any two adjacent grooves. A groove cycle "b" is defined as a sum of the distance a and a width of any one groove. A light intensity of light beams depends on the values of "d", "a" and "b". By selecting a desired duty cycle f=a/b for the diffraction grating, the reflected light beams are converged into ±1 order light beams. Almost all the ±1 order light beams are collected by the optical detectors, notwithstanding variations in operational temperature. The controlling circuit receives feedback signals from the optical detectors.

19 Claims, 3 Drawing Sheets

LASER-BASED LIGHT SOURCE

BACKGROUND OF THE INVENTION

1. Field of the Invention

The present invention relates to laser-based light sources, and particularly to laser-based light sources having controlled output light intensity.

2. Description of Prior Art

Semiconductor lasers are used as light sources in many consumer and industrial products such as laser printers, optical communications links, and optical storage systems. Semiconductor lasers are classified mainly as edge-emitting lasers and surface-emitting lasers. Edge-emitting lasers have relatively high threshold current, and surface-emitting lasers are relatively simple and inexpensive to manufacture. Therefore surface-emitting lasers, especially vertical-cavity surface-emitting lasers, are gradually replacing edge-emitting lasers in modern equipment. Surface-emitting lasers must be properly encased to prevent contamination and to minimize fluctuations in operational temperature.

A conventional laser-based light source as disclosed in JP-A-60-088486 is depicted in FIG. 1. A sub-mount 51 is provided with a laser diode 5 electrically and physically mounted thereon. The sub-mount 51 and an optical detector 6 are secured to a header 4, and enclosed by a can 3. A beam splitter 7 is fixed at a window 8 defined in a top of the can 3. Two electrical conductors 1, 2 respectively extend from the header 4, and electrically connect the laser diode 5 to a controlling circuit (not shown). Transmitted beams (not labeled) emitted from the laser 5 are divided by the beam splitter 7 into a series of diffraction beams (not labeled) serving as a signal-light source, and a series of reflected feedback-light beams (not labeled). The reflected feedback-light beams are collected and converted into electrical signals by the optical detector 6. The electrical signals are transferred to the controlling circuit via the electrical conductors 1, 2, to control the output power of the laser 5.

FIG. 2 shows a relationship between driving current I of the light source structure and output power $P_1$ of the laser 5, at different operational temperatures $T_1$, $T_2$. As is shown, the $P_1$-I characteristic curve 10 changes to the $P_1$-I characteristic curve 11 when the operational temperature rises from $T_1$ to $T_2$. That is, at a given driving current, the laser 5 generates different output power depending on fluctuations in the operational temperature. In order to provide stable output power of the laser 5, the controlling circuit (not shown) is employed to adjust the driving current and thereby achieve the desired stable output power of the laser 5.

FIG. 3 shows a relationship between reflected light intensity 12 of the laser 5 and a light receiving position X of the optical detector 6, at different operational temperatures $T_1$, $T_2$. As is shown, the light intensity distribution characteristic curve 12 changes to the characteristic curve 13 when the operational temperature rises from $T_1$ to $T_2$. Reflected light intensity received by the receiving area $x_1$–$x_2$ of the optical detector 6 changes, and a ratio of the light intensity received by the optical detector 6 to output power of the laser 5 accordingly also changes. Therefore the controlling circuit cannot control the output power of the laser 5 precisely, and the laser 5 becomes unstable.

SUMMARY OF THE INVENTION

In view of the above, it is an object of the present invention to provide a light source in which the output power of a laser can be steadily controlled by employing a diffraction grating.

It is another object of the present invention to provide a light source which can minimize the effect of varying operational temperatures on output power of the light source.

In order to achieve the objects set above, a laser-based light source in accordance with the present invention comprises a laser, two optical detectors symmetrically arranged on opposites sides of the laser, a diffraction grating mounted in a can, and a controlling circuit. A plurality of parallel grooves is defined in a bottom face of the diffraction grating. Each groove has a depth "d." A groove separation "a" is defined between any two adjacent grooves. A groove cycle "b" is defined as a sum of the distance a and a width of any one groove. A light intensity of light beams reflected from the diffraction grating depends on the values of "d", "a" and "b". By selecting a desired duty cycle f=a/b for the diffraction grating, the reflected light beams are converged into ±1 order light beams. Almost all the ±1 order light beams are collected by the optical detectors, notwithstanding variations in operational temperature. The controlling circuit receives feedback signals from the optical detectors, and precisely controls output power of the light source.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
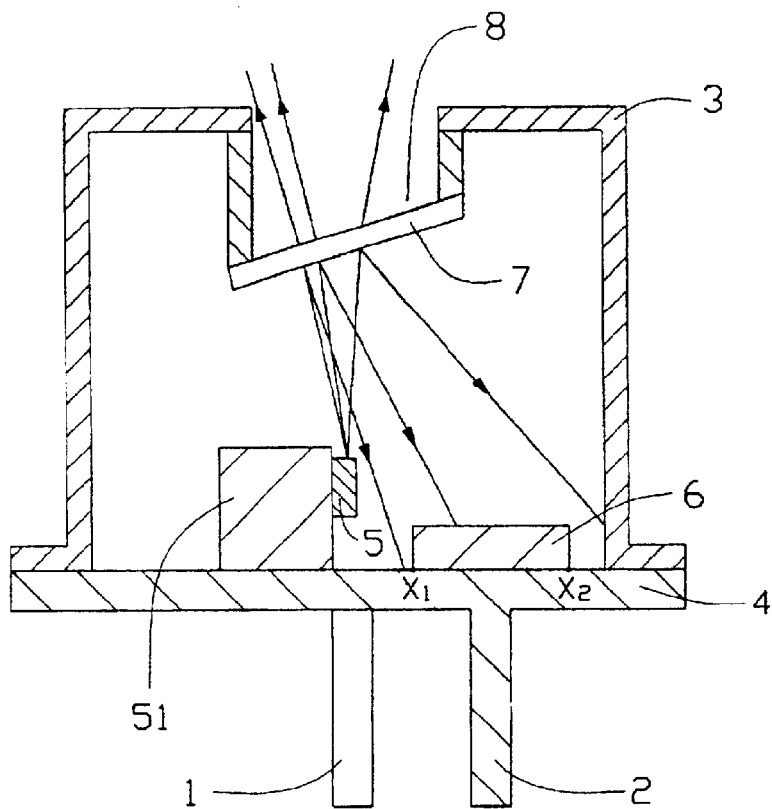
FIG. 1 is a cross-sectional view of a conventional laser-based light source.
Figure 2:
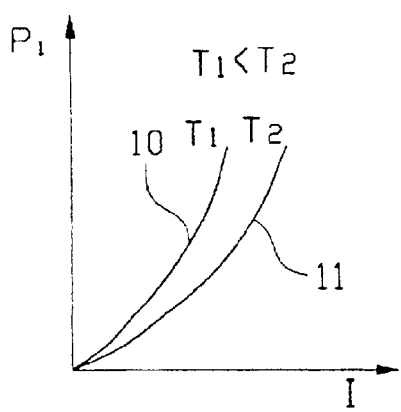
FIG. 2 is a graph illustrating a relationship between driving current of a laser of the light source of FIG. 1 and output power of that laser, at different operational temperatures.
Figure 3:
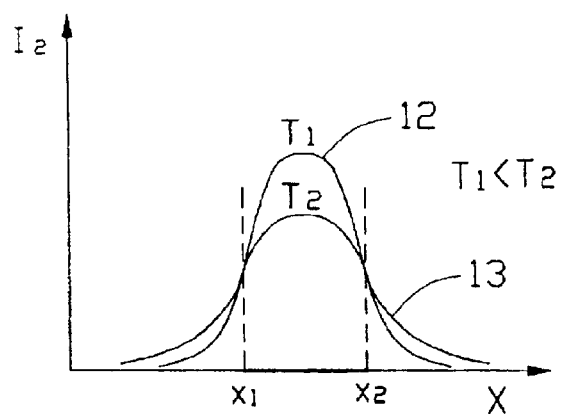
FIG. 3 is graph illustrating a relationship between reflected light intensity of the laser of the light source of FIG. 1 and a light receiving position of an optical detector of that light source, at different operational temperatures.
Figure 4:
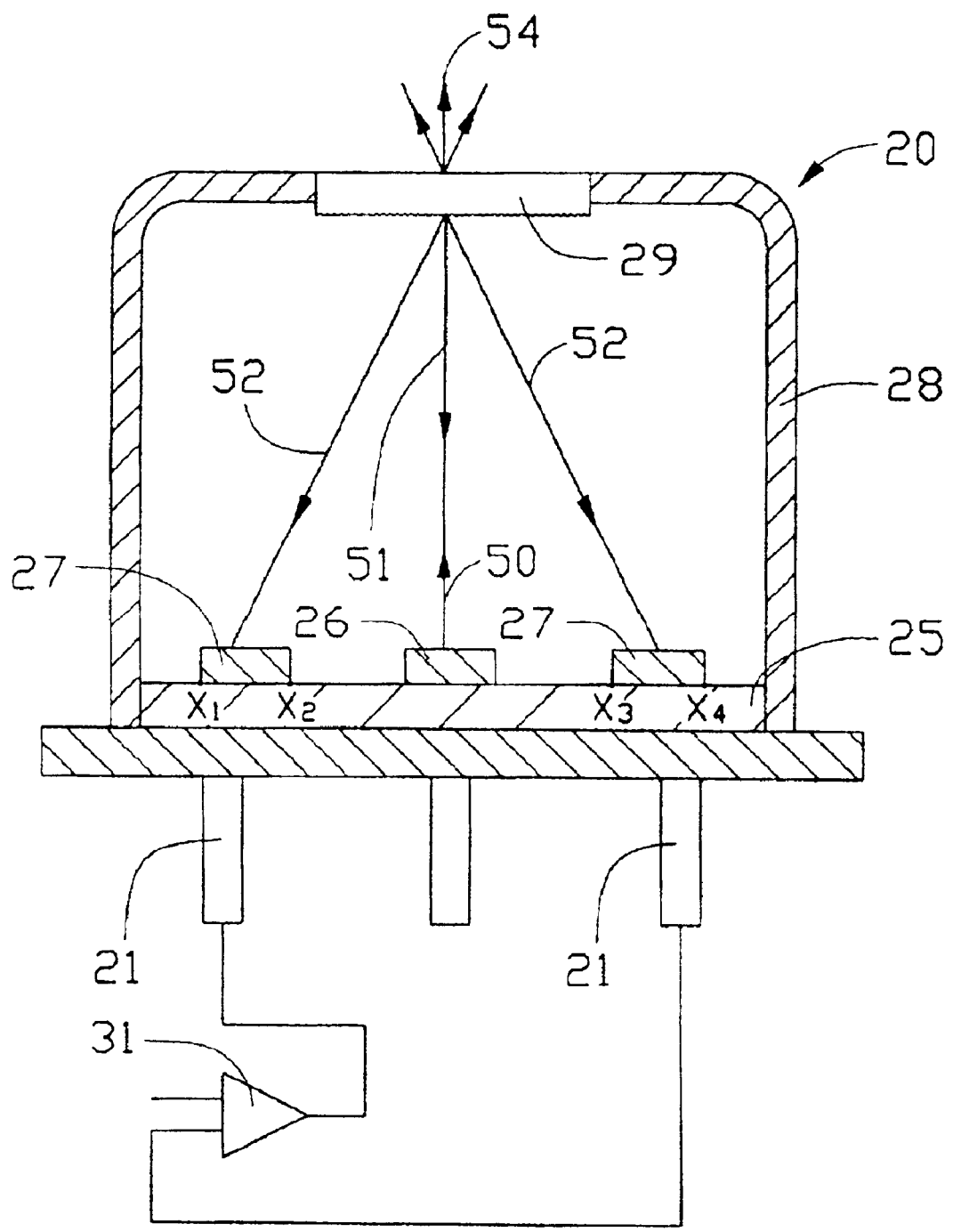
FIG. 4 is a schematic cross-sectional view of a light source in accordance with the present invention.

FIG. 4 shows a laser-based light source 20 in accordance with the present invention. The light source 20 comprises a mounting member 25 incorporating a circuitry (not shown) thereon. A laser 26 is mounted on a center of the mounting member 25, and is electrically connected with the circuitry of the mounting member 25. Two optical detectors 27 are symmetrically mounted on the mounting member 25 on opposite sides of the laser 26, and are electrically connected with the circuitry of the mounting member 25. Two electrical conductors 21 extend from the mounting member 25, and respectively electrically connect the optical detectors 27 to a controlling circuit 31. A can 28 is mounted on the mounting member 25, and encloses the laser 26 and the optical detectors 27 therein. A diffraction grating 29 is mounted in a center of a top portion of the can 28.

Figure 5:
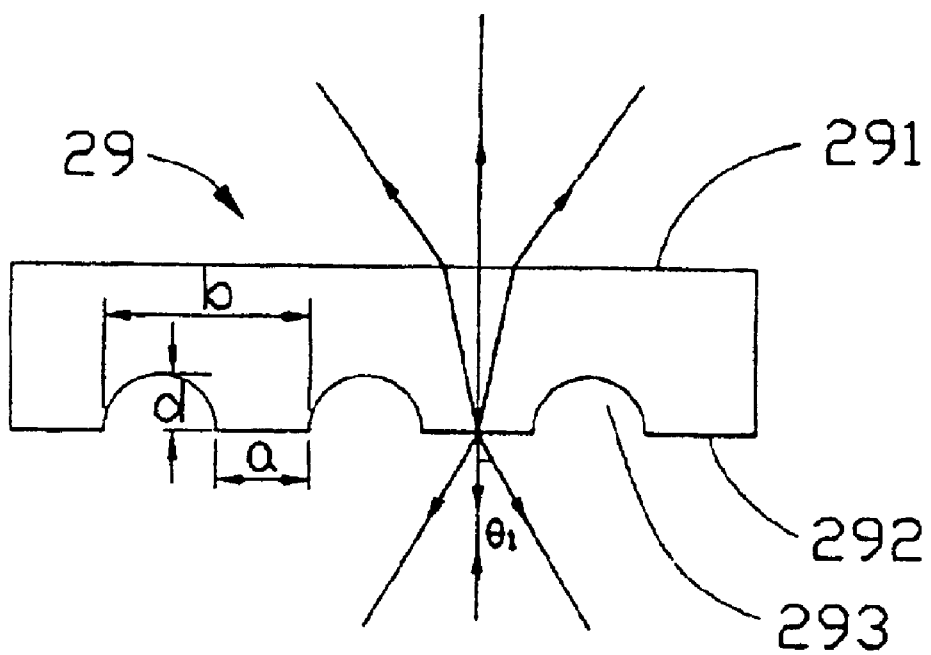
FIG. 5 is an enlarged view of a portion of a diffraction grating of the light source of FIG. 4.

FIG. 5 is an enlarged view of a portion of the diffraction grating 29. The diffraction grating 29 is formed from a glass plate. The diffraction grating 29 has a flat top face 291, and a bottom face 292 defining a plurality of parallel grooves 293 therein. Transmitted light beams 50 emitting from the laser 26 reach the diffraction grating 29 and undergo diffraction and reflection by the diffraction grating 29. As a result, a part of the transmitted light beams 50 is reflected and separated into zero order light beams 51, ±1 order light beams 52, ±2 order light beams (not shown) and higher order light beams. A thin film filter (not shown) is formed on the diffraction grating 29, for controlling a light intensity ratio of diffracted light beams 54 to the reflected light beams 51, 52 and higher order reflected light beams. Each groove 293 has a depth "d." A distance "a", hereinafter referred to as groove separation, is defined between any two adjacent grooves 293. A distance "b" is defined as the sum of distance a and a width of any one groove 293. The distance b is hereinafter referred to as groove cycle. In the present invention, a light intensity of each order of reflected light beams depends on the sizes of the grooves 293, and on the positions of the grooves 293 relative to each other. That is, the light intensity of the light beams 51, 52 and higher order reflected light beams depends on the values of "d", "a" and "b". A ratio of the intensity of the ±1 or −1 order light beams 51 to the zero order light beams 52 is given by $P_R = I_{+1}/I_0 = I_{-1}/I_0 = 4 \sin(\pi f) \sin^2(\theta_d/2)/\pi^2 [1-4f(1-f)\sin(\theta_d/2)]$ Where:

$f = a/b$ $\theta_d = 4\pi d(n \cos \theta_1 - \cos \theta_0)/\lambda$ $n \cos \theta_1 = (n^2 - \sin^2 \theta_0)^{1/2}$ n represents a refractive index of the diffraction grating 29;
λ represents a wavelength of the transmitted light beams 50 generated by the laser 26;
$\theta_1$ represents an angle of diffraction of reflected light beams; and
$\theta_0$ represents an angle of incidence of the transmitted light beams 50 when they reach the diffraction grating 29 (when the transmitted light beams 50 are perpendicular to the diffraction grating 29, $\theta_0 = 0$).

An intensity of ±2 order light beams and higher order reflected light beams is far less than intensities of the zero and ±1 order light beams 51, 52. Therefore, the intensity of ±2 order light beams and higher order reflected light beams can be ignored. Consequently, a desired ratio of the intensity of ±1 order light beams 52 to zero order light beams 51 can be obtained by selecting a suitable groove depth d, groove separation a, and duty cycle f=a/b. This is so that the intensity of reflected light beams from the diffraction grating 29 substantially concentrates on the ±1 order light beams 52. ±1 order light beams 52 are substantially collected by the optical detectors 27 regardless of fluctuations in operational temperature of the light source 20, as described below.

Figure 6:
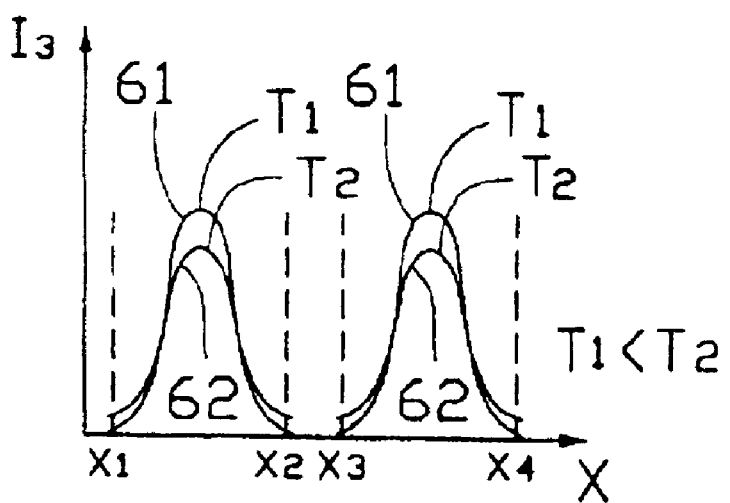
FIG. 6 is a graph illustrating a relationship between reflected light intensity of reflected light beams from the diffraction grating of the light source of FIG. 4 and a light receiving position X of optical detectors of that light source, at different operational temperatures.

FIG. 6 shows a relationship between reflected light intensity $I_3$ of reflected light beams from the diffraction grating 29 and a light receiving position X of the optical detectors 27, at different operational temperatures $T_1$, $T_2$ of the light source 20. As is shown, the reflected light intensity 13 versus light receiving position X curve 61 changes to curve 62 when the operational temperature rises from $T_1$ to $T_2$. However, almost all the reflected +1 order light beams 52 and −1 order light beams 52 are collected by the light receiving areas $x_1$–$x_2$ and $x_3$–$x_4$ of the optical detectors 27, notwithstanding the variation in operational temperature from $T_1$ to $T_2$. Thus the optical detectors 27 can feed substantially accurate actual total output power information of the laser 26 back to the controlling circuit 31. Therefore the output power of the laser 26 can be precisely controlled by the controlling circuit 31 according to the feedback signals obtained from the optical detectors 27, regardless of fluctuations in operational temperature.

A detailed example of the above-described apparatus is described below. It should be noted that, for the purposes of providing this example, certain values have been selected for the variables groove cycle b, groove depth d, duty cycle f and refractive index n. However, it is within the scope of the present invention to select other values for b, d, f and n to yield suitable results.

EXAMPLES

The diffraction grating 29 has a groove cycle b=1.52 μm, groove depth d=1.4 μm, duty cycle f=0.5, and refractive index n=1.5. It is assumed that the angle of incidence of the transmitted light beams 50 $\theta_0=0$, and that the wavelength of the transmitted light beams 50 generated by the laser 26 λ=0.85 μm. The ratio of the intensity of the +1 or −1 order light beams 51 to the zero order light beams 52 is then calculated as follows:

$n\cos\theta_1 = (n^2 - \sin^2\theta_0)^{1/2} = (1.5^2 - \sin^2 0)^{1/2} = 1.5$ $\theta_d = 4\pi d(n\cos\theta_1 - \cos\theta_0)/\lambda =$ $\qquad 4 \times 3.14159 \times 1.40 \times (1.5 - \cos 0)/0.85 = 10.34877$ $\qquad \sin^2(\theta_d/2) = 0.80132$ $P_R = I_{+1}/I_0 =$ $\qquad I_{-1}/I_0 = 4\sin(\pi f)\sin^2(\theta_d/2)/\pi^2[1 - 4f(1-f)\sin^2(\theta_d/2)] = 1.63461$ If the total output power of the laser 26 $P_{total}=0.6$ mW, and the ratio of light intensity of the diffracted light beams 54 to the reflected light beams 51, 52 controlled by the thin film filter R=3/7, then the intensity of the zero order light beams 52 and +1 (or −1) order light beams 51 can be respectively obtained as shown below:

$I_0 = P_{total} \times R/(1+2P_R) = 0.6 \times 3/7/(1+2 \times 1.63461) = 0.06023 \, mW$ $I_{+1} = I_{-1} = (P_{total} \times R - I_0)/2 = (0.6 \times 3/7 - 0.06023)/2 = 0.09846 \, mW$ As can be clearly seen, the obtained intensity of the ±1 order reflection beams 51 collected by the optical detectors 27 is suitable for practice of the invention.

It should also be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light source, comprising:

a mounting member;

electrical conductors extending from the mounting member, a light emitting device mounted on the mounting member and electrically connected to the electrical conductors, for generating light having a predetermined wavelength;

two optical detectors arranged on opposite sides of the light emitting device and connected with the electrical conductors;

a can mourned on the mounting member and enclosing the light emitting device and the optical detectors; and a diffraction grating fixed in the can, the diffraction grating defining a plurality of parallel grooves facing the light emitting device, each groove having a depth D, adjacent grooves being separated by a distance A, and a sum of the distance A and a width of any one groove being defined as a distance B; wherein part of light beams generated by the light emitting device we reflected by the diffraction grating, the reflected beams include at least zero order tight beams and a ±1 order light beams, the depth D and the distances A and B are determined so that the reflected light beams concentrate on the ±1 order light beams, and the optical detectors are located so that they collect most of the ±1 order light beams, wherein a desired ratio of intensity of the ±1 order light beams to the zero order light beams can be obtained by selecting a suitable depth D, distance A, and duty cycle F, wherein F=A/B;

whereby when the intensity of the reflected light beams substantially concentrates on the ±1 order light beams, the ±1 order light beams are substantially collected by the optical detectors.

2. The light source as described in claim 1, wherein the light emitting device is a surface-emitting laser.

3. The light source as described in claim 1, wherein the diffraction grating is made of glass.

4. The light source as described in claim 1, wherein the can defines a window, and the diffraction grating is mounted in the window.

5. A light source electrically connecting to a controlling circuit, the tight source comprising:

a mounting member;

electrical conductors extending from the mounting member;

a light emitting device mounted on the mounting member and electrically connected to the electrical conductors, for generating light having a predetermined wavelength;

two optical detectors arranged on opposite sides of the light emitting device and connected with the electrical conductors;

a can mounted on the mounting member and enclosing the light emitting device, and the optical detectors; and a diffraction grating fixed on the can, the diffraction grating defining a plurality of parallel grooves facing the light emitting device, each groove having a depth D, adjacent grooves being separated by a distance A, and a sum of the distance A and a width of any one groove being defined as a distance B; wherein part of light beams generated by the light emitting device are reflected by the diffraction grating, the reflected light beams include at least zero order light beams and ±1 order light beams, the depth D and the distances A and B are determined so that the reflected light beams concentrate on the ±1 order reflected beams, and the optical detectors are located so that they collect most of the ±1 order beams;

wherein a desired ratio of intensity of ±1 order light beams to zero order light beams can be obtained by selecting a suitable groove depth D, distance A, and duty cycle F, wherein F=A/B, whereby when the intensity of the reflected light beams substantially concentrates on the ±1 order light beams, the k order light beams are substantially collected by the optical detectors and converted into corresponding electrical signals transmitted to the controlling circuit, thereby precisely controlling output power of the light emitting device.

6. The light source as described in claim 5, wherein the light emitting device is a surface-emitting laser.

7. The light source as described in claim 5, wherein the can defines a window, and the diffraction grating is mounted in the window.

8. The light source as described in claim 5, wherein the diffraction grating is made of glass.

9. A laser based light source comprising:

a light omitting device generating a light;

a diffraction grating spaced from said light emitting device and the light is directed to; and at least an optical detector positioned beside the light emitting device, and along with said light emitting device on a same side of said diffraction grating commonly facing thereto; wherein said optical detector is located in a position where a main reflected light beam resulting from the light hitting the diffraction grating with a specific reflection angle, is targeted thereon.

10. The light source as described in claim 9, wherein said specific reflection angle results in said main reflected light beam to be either a reflected +1 order light beam or a reflected −1 order light beam.

11. The light source as described in claim 10, wherein another optical detector is positioned opposite to said optical detector, and cooperates therewith to receive both said reflected +1 order light beam and said reflected −1 order light beam, respectively.

12. The light source as described in claim 11, wherein said another optical detector and said optical detector are located by two sides of said light emitting device.

13. The light source as described in claim 9, wherein an incident angle of the light from the light omitting device relative to the diffraction grating is zero.

14. A method of making a laser-based light source, comprising the steps of:

providing a light emitting device generating a light;

providing a diffracting grating spaced from said light emitting device; and providing an optical detector device aside said light emitting device where a reflected +1 order or −1 order light beam derived from the light hitting said diffraction grating, is substantially completely targeted.

15. The method as described in claim 14, further comprising a step of controlling an output power of the light emitting device according to what is detected by said optical detector.

16. The method as described in claim 14, wherein the optical detector device receives both the reflected +1 and −1 order light beams.

17. The method as described in claim 16, wherein said optical detector device includes a pair of detectors respectively to receive said reflected +1 and −1 order light beams.

18. The method as described in claim 17, wherein said pair of detectors are respectively positioned by two sides of said light emitting device.

19. A laser based light source comprising:

a tight emitting device generating a light;

a diffraction grating spaced from said light emitting device and the tight is directed to; and a pair of optical detectors positioned by two opposite sides of the light omitting device, and along with said light emitting device on a same side of said diffraction grating commonly facing thereto; wherein both ±1 order light beams derived from the light hitting the diffraction grating, are substantially completely targeted on said pair of optical detectors, respectively.

* * * * *